United States Patent [19]

Harada et al.

[11] Patent Number: 4,672,244
[45] Date of Patent: Jun. 9, 1987

[54] JOSEPHSON LOGIC INTEGRATED CIRCUIT

[75] Inventors: Yutaka Harada, Kodaira; Ushio Kawabe, Nishitama; Nobuo Kotera, Kokubunji; Atsushi Asano, Hachioji, all of Japan

[73] Assignee: Hitachi, Ltd., Tokyo, Japan

[21] Appl. No.: 782,185

[22] Filed: Sep. 30, 1985

Related U.S. Application Data

[63] Continuation of Ser. No. 451,096, Dec. 20, 1982, abandoned.

[30] Foreign Application Priority Data

Dec. 23, 1981 [JP] Japan ................................. 56-206933

[51] Int. Cl.[4] ........................................ H03K 19/195
[52] U.S. Cl. .................................... 307/476; 307/277; 307/306

[58] Field of Search ............... 307/277, 306, 462, 476, 307/473; 365/162; 357/5; 364/784-786

[56] References Cited

U.S. PATENT DOCUMENTS

| 4,092,553 | 5/1978 | Fang et al. ........................... 307/476 |
| 4,136,290 | 1/1979 | Davidson et al. ................... 307/462 |
| 4,360,898 | 11/1982 | Faris ..................................... 365/162 |

Primary Examiner—John Zazworsky
Attorney, Agent, or Firm—Antonelli, Terry & Wands

[57] ABSTRACT

A Josephson logic integrated circuit packaged on a single substrate, wherein a portion for delivering an output out of the integrated circuit is constructed of an A.C.-driven Josephson logic circuit, and a portion for driving the internal part of the integrated circuit is constructed of a D.C.-driven Josephson logic circuit.

10 Claims, 17 Drawing Figures

JOSEPHSON LOGIC INTEGRATED CIRCUIT

This application is a continuation, of application Ser. No. 451,096, filed Dec. 20, 1982, now abandoned.

FIELD OF THE INVENTION

The present invention relates to the structure of a logic integrated circuit employing superconducting devices, particularly Josephson junction devices, and the method of logical construction therefor.

BACKGROUND OF THE INVENTION

Logic circuits employing Josephson junction devices can be broadly classified into circuits driven by an A.C. source and circuits driven by a D.C. source. The A.C.-driven circuit has the advantages that the circuit speed is high, that the signal voltage amplitude is large, and that the load driving capacity is large. However, in case of applying it to a large-sized computer system of high operating speed, it has caused the following problems:

(1) Since the phase of the A.C. source corresponds to the clock of the logic circuit, the phases of the A.C. sources for the respective logic circuits need to be precisely adjusted. Especially when large quantities of logic circuits are used as in the large-sized computer, it is difficult to precisely adjust the A.C. source phases of all the logic circuits.

(2) The process in which the Josephson junction device shifts from the non-superconducting state into the superconducting state, cannot be applied to a logical operation. Therefore, when a logic arrangement is constructed, the number of circuits becomes larger with the A.C.-driven circuit than in case of relying on semiconductor technology.

(3) The large-sized computer system of fast operation requires an oscillator of high power and high frequency.

(4) In order to prevent the Josephson junction device from shifting from the superconducting state into the non-superconducting state unnecessarily, noise to be involved in a signal must be made very small. Particularly in the case of the large-sized computer, it is difficult to adjust and clear all pulse waveforms.

(5) When the current source is switched fast, there occurs the so-called punch-through phenomenon in which the Josephson junction device used in the circuit fails to return into the superconducting state. This phenomenon occurs at a probability, and when a large number of circuits are used as in the large-sized computer, the probability at which the punch-through phenomenon occurs in the whole system becomes high, so that the reliability of the whole system is lowered.

(6) An A.C. distribution system assumes a large installation area, and the packaging density of the A.C.-driven circuit does not become high.

It is therefore difficult to construct the large-sized computer system out of only the A.C.-driven circuits.

The D.C.-driven circuit is free from the problems of the A.C. source drive system already mentioned. Known circuits based on prior arts, however, have caused the following problems:

(1) The D.C.-driven circuit is a circuit which cannot drive a transmission line, or even when it can drive a transmission line, it is a circuit of small signal amplitude voltage. Therefore, the load driving capacity is small.

(2) The D.C.-driven circuit is a circuit which cannot drive a transmission line, or is a circuit which can drive only a transmission line of low characteristic impedance.

This causes such problems as:

(a) inferior matching with a transmission line outside an LSI, and (b) great delay due to an inductive load.

It is therefore difficult to construct a large-sized computer of a structure employing a large number of LSIs and connecting the LSIs by transmission lines, out of only D.C.-driven circuits.

SUMMARY OF THE INVENTION

An object of the present invention is to provide a Josephson logic integrated circuit which cancels the disadvantages of both a D.C.-driven circuit and an A.C.-driven circuit, thereby being suited to the element of a large-sized computer.

Another object of the present invention is to provide a Josephson logic integrated circuit which is easy to use for logic design.

The present invention is characterized in that a D.C.-driven circuit employing a Josephson junction device is used as an internal circuit of an integrated circuit, while an A.C.-driven circuit employing a Josephson junction device is used as a circuit for driving the exterior of the integrated circuit.

In accordance with the present invention, an LSI which is easy to use for logical construction and which has a large load driving capacity can be provided. With the LSIs according to the present invention, therefore, it is possible to construct a large-sized computer which has a wide design margin, which can be rendered high in packaging density and which has a high speed as well as a high reliability.

PREFERRED EMBODIMENTS OF THE INVENTION

Figure 1:
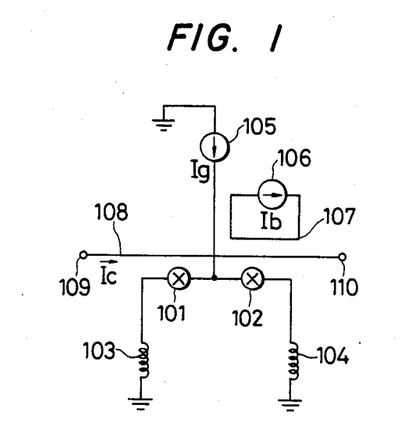
FIG. 1 shows an example of a D.C.-driven circuit which is used as an internal circuit in the present invention.

Now, the present invention will be described in conjunction with embodiments. FIG. 1 shows an example of a D.C. source circuit which is used as the internal circuit of an integrated circuit (hereinbelow, the general term "LSI" to signify a large-scale integrated circuit shall be used). The circuit shown in FIG. 1 is a kind of D.C.-driven circuit which is called a "current steering circuit" (hereinbelow, abbreviated to "CS circuit"). First and second Josephson junction devices 101 and 102 and first and second inductors 103 and 104 constitute a closed loop circuit, the middle point of which is supplied with a gate current $I_g$ from a direct current source 105. A control line 108 is arranged near the first and second Josephson junction devices 101 and 102 so that a magnetic flux generated by a control current $I_c$ flowing through terminals 109 and 110 may interlink with the first and second Josephson junction devices. A bias line 107 is arranged near the second Josephson junction device 102 so that a magnetic flux generated by a bias current $I_b$, which is supplied from a direct urrent source 106 and which flows through the bias line 107, may interlink with the Josephson junction device 102. In this case, the direction in which the bias current $I_b$ flows is made reverse to the direction in which the control current $I_c$ flows, so that the magnetic fluxes generated by the respective currents cancel each other. The maximum superconducting current which can flow through the Josephson junction device, is controlled by the magnetic flux which interlinks with the Josephson junction device. The maximum superconducting current which can flow through the Josephson junction device when the magnetic flux does not interlink, is great, whereas the maximum superconducting current which can flow through the Josephson junction device when the magnetic flux interlinks, is small. Therefore, in a case where the control current $I_c$ does not flow through the control line 108 in the circuit shown in FIG. 1, the magnetic flux does not interlink with the Josephson junction device 101, and the magnetic flux interlinks with the Josephson junction device 102, so that a great part of the gate current $I_g$ flows to the load inductor 103 through the Josephson junction device 101. In a case where the control current $I_c$ flows through the control line 108, the magnetic flux interlinks with the Josephson junction device 101, and the magnetic flux does not interlink with the Josephson junction device 102, so that a great part of the gate current $I_g$ flows to the load inductor 104 through the Josephson junction device 102. When the control current is taken as an input signal and the current flowing to the load inductor 103 is taken as an output signal, the circuit shown in FIG. 1 becomes an inverter circuit, and when the current flowing to the load inductor 104 is taken as an output signal, the circuit operates as a converter circuit. While the circuit shown in FIG. 1 illustrates the example in which the single control line is arranged, it is to be understood that an OR or NOR output circuit can be realized by arranging two or more control lines in a circuit similar to that of FIG. 1. Since the circuit of FIG. 1 forms the superconducting loop, it cannot drive a transmission line. However, in a case where only a light load is driven as in an LSI, a satisfactorily fast logic can be constructed by the use of the circuit shown in FIG. 1.

Figure 2:
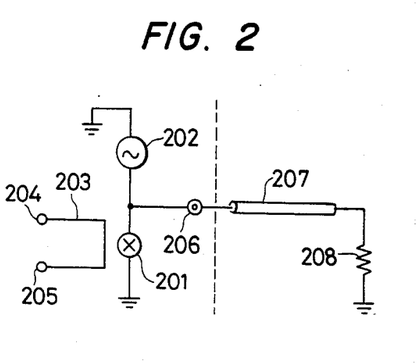
FIG. 2 shows an example of an A.C.-driven circuit which is used as an output circuit in the present invention.

FIG. 2 shows an example of a circuit which is used as the output circuit of an LSI in the present invention. The circuit shown in FIG. 2 is a kind of A.C.-driven circuit which is called "Josephson tunneling logic circuit" (hereinbelow, abbreviated to "JTL circuit"). One end of a Josephson junction device 201 is grounded, while the other end is connected to an alternating current source 202 and is also connected to an output pad 206 of the LSI. A control line 203 is arranged near the Josephson junction device 201, and a magnetic flux, which is generated by current flowing through the control line 203 via terminals 204 and 205, interlinks with the Josephson junction device 201. The output terminal 206 is grounded through a transmission line 207 and a terminating resistor 208 which are locatd outside the LSI. In the circuit shown in FIG. 2, in a case where the control current does not flow through the control line 203, the Josephson junction device 201 is in the superconducting state, and no current flows through the transmission line 207. In contrast, in a case where the control current flows through the control line 203, the Josephson junction device 201 is in the non-superconducting state, so that current flows through the transmission line 207. It is to be understood that, when the control current is taken as an input signal and the current flowing through the transmission line is taken as an output signal, the circuit shown in FIG. 2 operates as a converter circuit. The circuit shown in FIG. 2 is an A.C.-driven circuit, so that when it is made of, e.g., a Pb-based metal, the output signal can be made as great as about 2.5 mV and can drive a transmission line of approximately 10 Ω.

Figure 3:
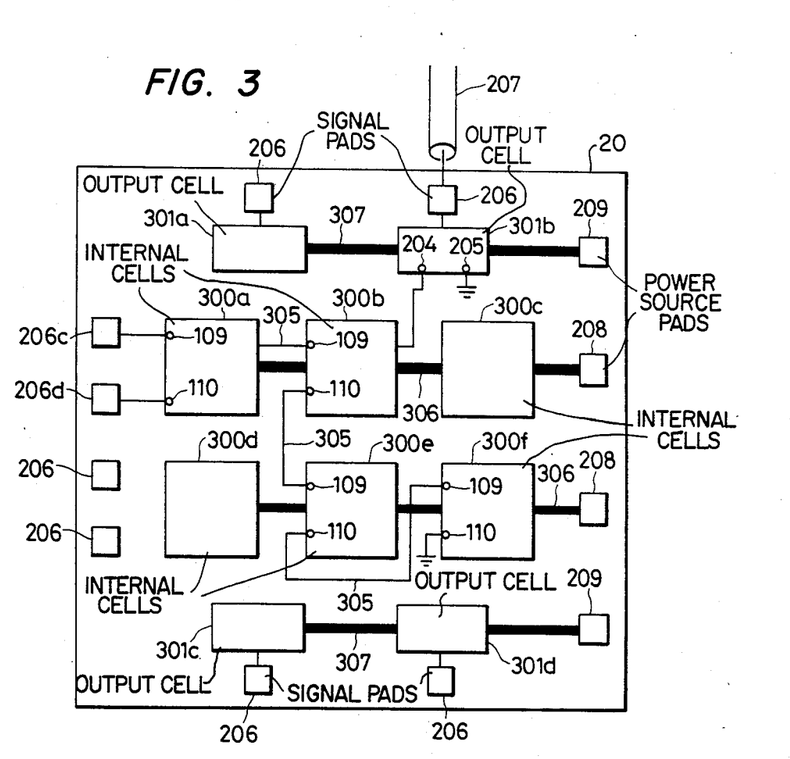
FIGS. 3 and 4 are plan views each showing the structure of an LSI of an embodiment of the present invention.

FIG. 3 shows the whole arrangement of an LSI embodying the present invention.

This LSI is integrated on a substrate of a single crystal similarly to a monolithic semiconductor integrated circuit. A Si single crystal or the like is used as a substrate 20, and a superconducting metal film called "ground plane" is formed on almost all the area thereof. Circuit elements to be described below are formed on the ground plane.

A plurality of internal cells 300a–300f are arranged in the central part of the LSI, while a plurality of output cells 301 are arranged in the peripheral part of the LSI. The CS circuit which is the D.C.-driven circuit shown in FIG. 1 can be arranged in the internal cells, while the JTL circuit whichis the A.C.-driven circuit shown in FIG. 2 can be arranged in the output cells. A plurality of signal pads 206 are arranged in the peripheral part of the LSI. The respective internal cells are connected to D.C. source wiring 306, one end of which is connected to a power source pad 208 for connecting a D.C. source from the exterior. In addition, the respective external cells are connected to A.C. source wiring 307, one end of whichis connected to a power source pad 209 for connecting an A.C. source from the exterior. By way of example, a signal from outside the LSI is applied to the D.C.-driven circuit within the internal cell 300a through the pads 206c, 206d and the terminals 109, 110 of the internal cell 300a. The D.C.-driven circuit of the internal cell 300a drives the D.C.-driven circuits within the internal cells 300b, 300e and 300f by the use of the internal signal wiring 305 of the LSI. The internal signal wiring is grounded at the final stage. This internal signal wiring 305 is equivalently regarded as an inductor, which corresponds to the load inductor 103 or 104 in the CS circuit of FIG. 1. The D.C.-driven circuit included in the internal cell 300b drives the A.C.-driven circuit included in the output cell 301b. The A.C.-driven circuit included in the output cell 301b drives the transmission line 207 located outside the LSI. In the arrangement of the LSI shown in FIG. 3, most logics in the LSI are built by the D.C.-driven circuits, so tha logics can be easily constructed, and the A.C.-driven circuit is used as the output circuit of the LSI, so the load driving capability of the LSI is large. In addition, with the LSI according to the present invention, the A.C.-driven circuit is used as only the output circuit of the LSI, so that the total number of A.C.-driven circuits within a large-sized computer system is small, and the disadvantages of the A.C.-driven circuit mentioned before can be covered by adjustments etc. Moreover, when the packaging density of the LSI becomes high, the total number of A.C.-driven circuits can be sharply reduced. Besides, when the A.C.-driven circuits are used as a group of registers, the property that these A.C.-driven circuits can be reset all at once at the current zero point of the A.C. source can be skilfully utilized.

Figure 4:
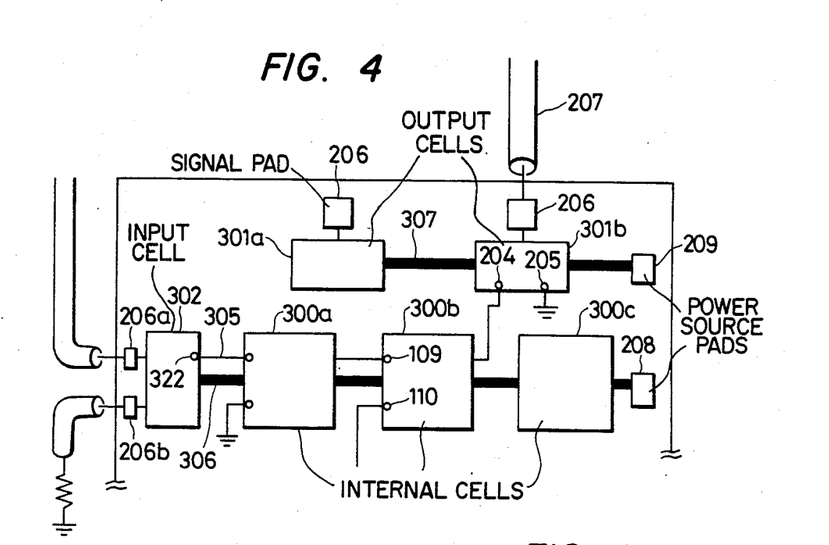

FIG. 4 shows the second embodiment of the LSI of the present invention. This embodiment differs from the embodiment of FIG. 3 in point of providing an input cell which receives an output signal from the A.C.-driven output cell of another LSI and which converts it into a signal level for the internal cell and then transmits it to the internal cell.

More specifically, as illustrated in FIG. 2, the A.C.-driven circuit has the three statuses; the status (the logic value "+1") in which current flows out to the load, the status (the logic value "−1") in which current flows in from the load, and the status (the logic value "0") in which no current flows. Equivalently, it is the so-called three-valued logic circuit. In contrast, the D.C.-driven circuit is the so-called two-valued logic circuit in which, for example, the presence and absence of current flowing through a load correspond to logic values "1" and "0", respectively. In the LSI of FIG. 4, therefore, the external input signal of three-valued logic coupled to the signal pads 206a, 206b is applied to the input cell 302 which converts the input signal into two-valued logic. The output of the input cell is applied from an output terminal 322 to the internal cell 300a through the internal signal wiring 305.

Figure 5:
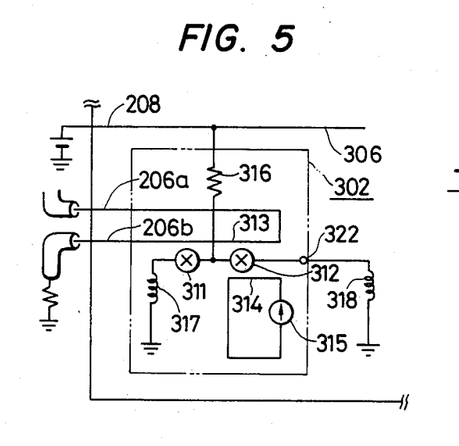
FIGS. 5, 7, 9 and 10 are circuit diagrams each showing an example of an input cell in the embodiment of FIG. 4.
Figure 6A:
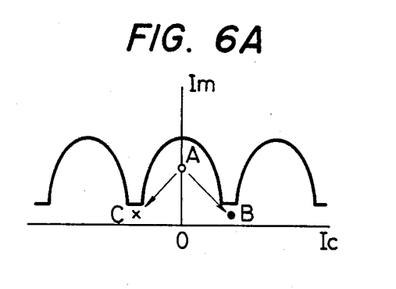
FIGS. 6A and 6B, and FIGS. 8A and 8B are diagrams for explaining operations in FIG. 5 and FIG. 7, respectively.
Figure 6B:
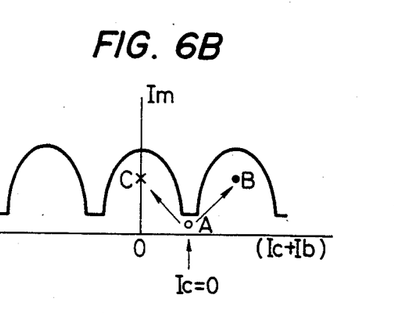

FIG. 5 shows the first example of an input circuit which is included in the input cell 302 of FIG. 4. The input circuit shown in FIG. 5 is a modified circuit of the so-called current steering circuit (CS circuit). Josephson interferometers 311 and 312, for example, each using three junctions as disclosed in U.S. Pat. No. 4,117,503 and load inductors 317 and 318 form one superconducting loop, the middle point of which is connected to D.C. source wiring 306 within the LSI through a resistor 316. The load inductor 318 corresponds to the inductances of the internal signal wiring 305 in FIG. 4 and the control lines of the internal cells 300a etc. A control line 313 is arranged near the Josephson interferometers 311, 312, and a magnetic flux, which is generated by a control current $I_c$ flowing through the control line 313 via the pair of input signal pads 206a, 206b, interlinks with the Josephson interferometers 311, 312. A bias line 314 is arranged near the Josephson interferometer 312, and a magnetic flux, which is generated by a bias current $I_b$ supplied from a constant current source 315 to the bias line 314, interlinks with the Josephson interferometer 312. The operations of the input circuit shown in FIG. 5 will now be described with reference to FIGS. 6A and 6B. FIG. 6A illustrates the threshold characteristics and operating points of the Josephson interferometer 311, while FIG. 6B illustrates the threshold characteristics and operating points of the Josephson interferometer 312. Curves in FIGS. 6A and 6B represent the maximum superconducting currents which can flow through the Josephson interferometers 311 and 312, as a function of the control current $I_c$ and as a function of the sum between the control current $I_c$ and the bias current $I_b$, respectively, and they are usually called "threshold curves". The operating points in the case where the control current $I_c$ does not flow in the input circuit shown in FIG. 5, are a point A in FIG. 6A as to the Josephson interferometer 311 and a point A in FIG. 6B as to the Josephson interferometer 312. Since, in this case, most of a gate current $I_g$ flowing through the resistor 316 flows to the load inductor 317 through the Josephson interferometer 311, little current flows to the load inductor 318 through the Josephson interferometer 312 as well as the output terminal 322. The operating points of the Josephson interferometers 311 and 312 in the case where the control current $I_c$ flows from the signal input pad 206a toward that 206b, are respectively denoted by points B in FIGS. 6A and 6B, and the operating points of the Josephson interferometers 311 and 312 in the case where the control current $I_c$ flows from the signal input pad 206b toward that 206a, are respectively denoted by points C in FIGS. 6A and 6B. In both the cases, most of the gate current $I_g$ flowing through the resistor 316 flows to the load inductor 318 through the Josephson interferometer 312 as well as the output terminal 322. As understood from the above description, the circuit shown in FIG. 5 converts the signal level of the output circuit shown in FIG. 2, into the signal level within the LSI. With the circuit shown in FIG. 5, the current flowing through the load inductor 317 and the current flowing through the load inductor 318 can be taken out as signals complementary to each other. Each of the Josephson interferometers 311 and 312 to be used may well consist of two junctions.

Figure 7:
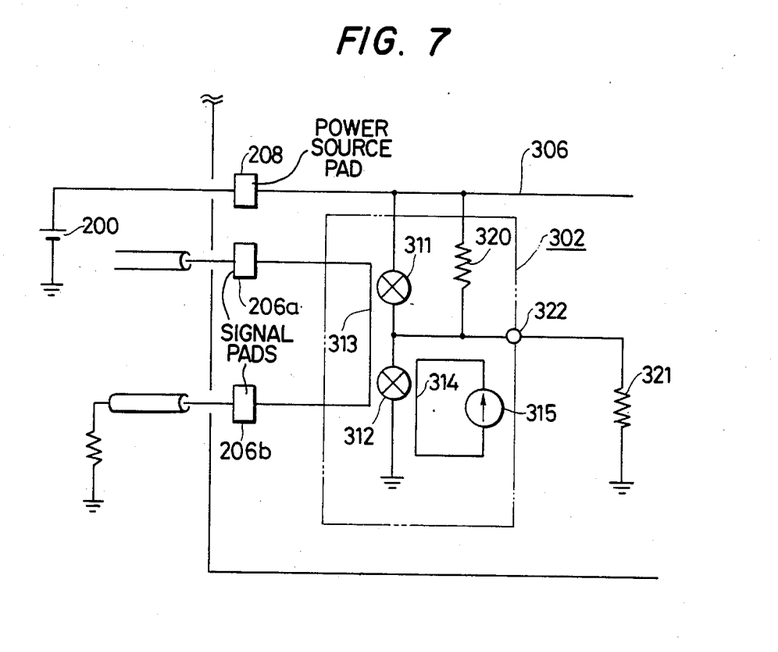
Figure 8A:
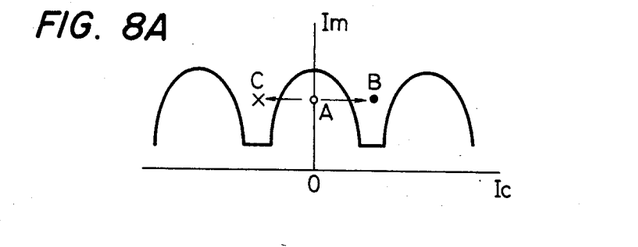
Figure 8B:
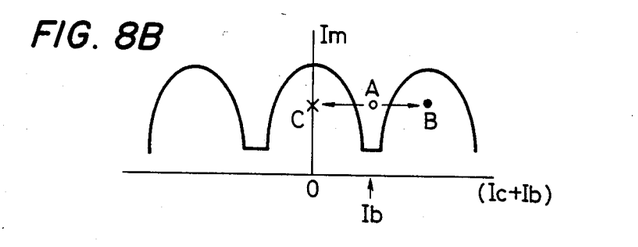

FIG. 7 shows the second example of the circuit which can be used as the input circuit. The circuit shown in FIG. 7 is a modification of the so-called complementary circuit. The Josephson interferometer 311 having a resistor 320 connected in parallel therewith, and the Josephson interferometer 312 having a resistor 321 connected in parallel therewith through the output terminal 322 are connected in series. One end of the series connection is grounded, while the other end is connected to the D.C. source wiring 306 within the LSI. It is the same as in the circuit shown in FIG. 5 that the control line 313 is arranged near the Josephson interferometers 311 and 312 and that the bias line 314 is arranged near the Josephson interferometer 312. When the voltage of a D.C. source 200 is made smaller than the minimum voltage at which the two Josephson interferometers 311 and 312 can simultaneously stay in the non-superconducting states, it is possible to put either the Josephson interferometer 311 or 312 into the superconducting state, with the other interferometer being in the non-superconducting state. The operating points of the Josephson interferometers 311 and 312 at the time at which the control current does not flow, are respectively denoted by points A in FIGS. 8A and 8B. At this time, the Josephson interferometer 311 is in the superconducting state, and the Josephson interferometer 312 is in the non-superconducting state, so that current flows to the resistor 321 through the output terminal 322. The operating points of the Josephson interferometers 311 and 312 at the time at which the control current flows from the signal input pad 206a toward that 206b are respectively indicated by points B in FIGS. 8A and 8B, and the operating points in the case where the control current flows reversely are respectively indicated by points C. When the control current flows in either direction, the Josephson interferometer 311 is in the non-superconducting state, and the Josephson interferometer 312 is in the superconducting state, so that no current flows to the resistor 321. Using the resistor 321 as the terminating resistor as thus far described, the current leading thereto can be employed as the control current of the internal cells 300a etc. in FIG. 4.

Figure 9:
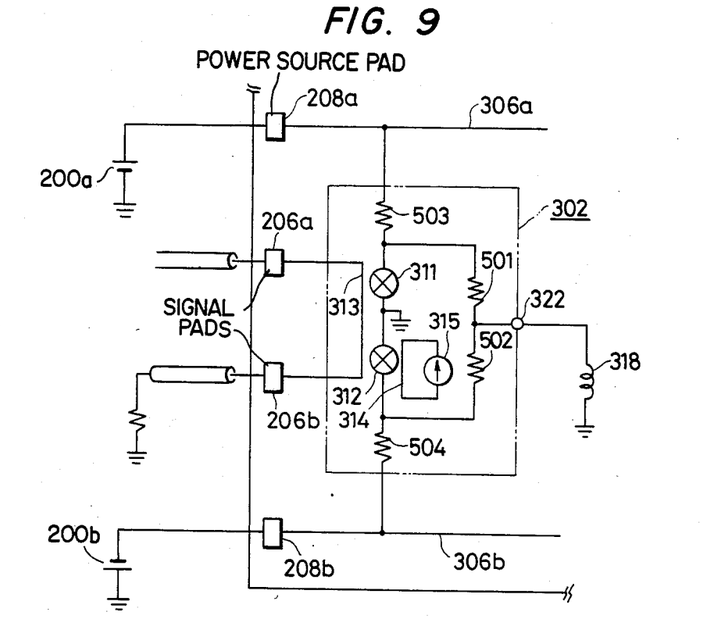

FIG. 9 shows the third example of the circuit which can be used as the input circuit within the input cell 302. The circuit shown in FIG. 9 is a modification of the so-called Huffle circuit. The present embodiment requires two, positive and negative, power sources. Accordingly, D.C. source wiring 306a of positive potential and D.C. source wiring 306b of negative potential are required as D.C. source wiring leads within the LSI. Symbols 208a and 208b represent power source pads for connecting a positive potential source 200a and a negative potential source 200b, respectively. One end of the Josephson interferometer 311 is grounded, while the other end is connected to the D.C. source wiring 306a of the positive potential through a resistor 503 and is also connected to the output terminal 322 through a resistor 501. One end of the Josephson interferometer 312 is grounded, while the other end is connected to the D.C. source wiring 306b of the negative potential through a resistor 504 and is also connected to the output terminal 322 through a resistor 502. The output terminal 322 is grounded through the load inductor 318. It is the same as in the circuit shown in FIG. 5 that the control line 313 is arranged near the Josephson interferometers 311 and 312, and that the bias line 314 is arranged near the Josephson interferometer 312. In the Huffle circuit, the Josephson interferometers 311 and 312 perform complementary operations, that is, they operate so that, when one is in the superconducting state, the other becomes the nonsuperconducting state. The operating points of the Josephson interferometers 311 and 312 at the time at which the control current does not flow, are respectively denoted by the points A in FIGS. 8A and 8B. At this time, the Josephson interferometer 311 is in the superconducting state, and the Josephson interferometer 312 is in the non-superconducting state, so that current through the resistor 503 flows in the order of the Josephson interferometer 311 and the ground, while current through the resistor 504 flows in the order of the ground, the load inductor 318, the resistor 502 and the resistor 504. The operating points of the Josephson interferometers 311 and 312 at the time at which the control current flows from the input signal pad 206a toward that 206b, are respectively denoted by the points B in FIGS. 8A and 8B, and the operating points at the time at which the control current flows in the reverse direction, are respectively denoted by the points C. when the control current flows in either direction, the Josephson interferometer 311 is in the non-superconducting state, and the Josephson interferometer 312 is in the superconducting state, so that current through the resistor 503 flows in the order of the resistor 501, the load inductor 318 and the ground, while current through the resistor 504 flows in the order of the ground and the Josephson interferometer 312.

Figure 10:
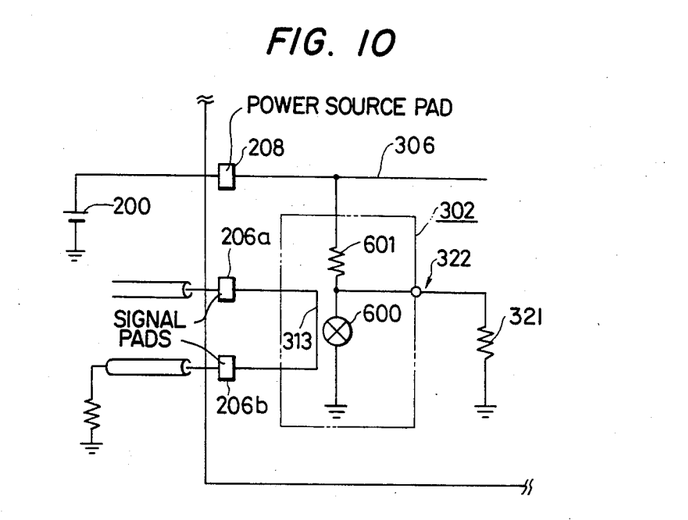

FIG. 10 shows the fourth example of the circuit which can be used as the input circuit within the input cell 302. The circuit shown in FIG. 10 is the so-called JTL circuit of the D.C. source drive system. One end of a Josephson junction device 600 is grounded, while the other end is connected to the D.C. source wiring 306 through a resistor 601 and is simultaneously grounded through the output terminal 322 as well as a resistor 321.

In a case where the control current does not flow through the control line 313, the Josephson junction device 600 is in the superconducting state, and the gate current flowing through the resistor 601 flows through the Josephson junction device 600, so that no current flows to the resistor 321. In a case where the control current flows, the Josephson junction device 600 is in the non-superconducting state irrespective of the flowing direction of the current, so that the gate current flowing through the resistor 601 flows to the resistor 321. Thus, using the resistor 321 as a terminating resistor, the current leading thereto can be employed as the control current of the internal cells 300a etc. in FIG. 4.

Figure 11:
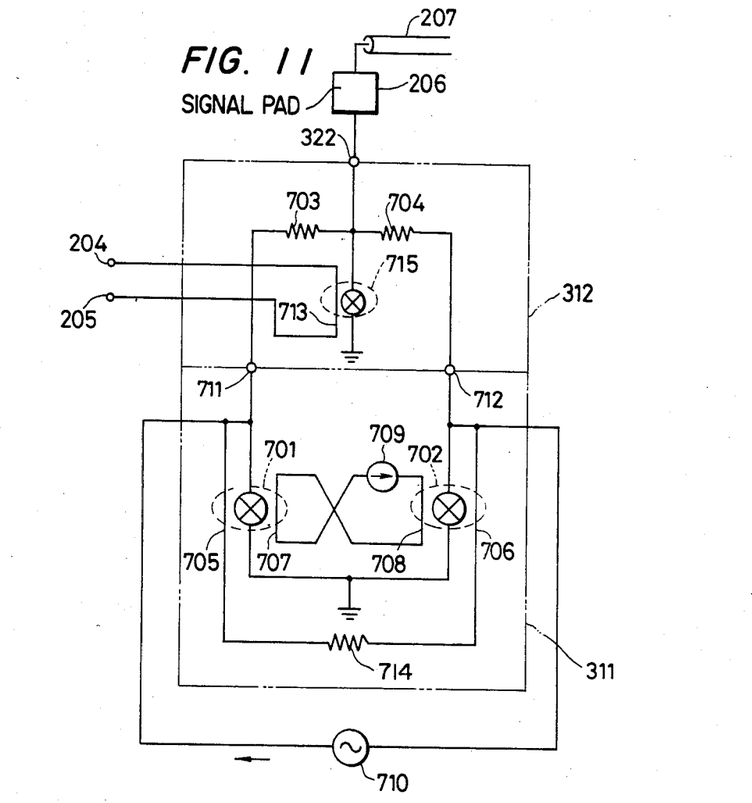
FIGS. 11, 12 and 13 are circuit diagrams each showing an example of an output cell in the embodiment of FIG. 3 or FIG. 4.

In the several embodiments described with reference to FIGS. 4 to 10, the three-valued logic signal from the A.C.-driven output cell of another LSI is converted into the two-valued logic signal by the input cell, and the converted signal is transmitted to the internal cell. On the other hand, when the output cell of the LSI is an A.C.-driven output cell which generates an output signal of the two-valued logic, the input cell for the signal conversion as described above is dispensed with. An example of the output cell, which is used instead of the output cell 301 in the embodiment of FIG. 3 for such purpose, is shown in FIG. 11. The present output cell consists of a rectifier circuit 311 and a switching circuit 312.

One end of a first Josephson junction device 701 is grounded, while the other end is connected to a terminal 711. One end of a second Josephson junction device 702 is grounded, while the other end is connected to a terminal 712. A first bias line 707 is arranged near the first Josephson junction device 701, and a second bias line 708 is arranged near the second Josephson junction device 702, so that a magnetic flux generated by a bias current $I_b$, which is supplied from a bias current source 709 and which flows through the bias lines 707 and 708, inerlinks with the Josephson junction devices 701 and 702. Near the first Josephson junction device 701 a first control line 705 is arranged, one end of which is connected to the terminal 711 and the other end of which is connected to one end of a resistor 714. Near the second Josephson junction device 702 a second control line 706 is arranged, one end of which is connected to the terminal 712 and the other end of which is connected to the other end of the resistor 714. An A.C. source 710 is connected between the terminals 711 and 712. A resistor 703 is connected between the terminal 711 and an output terminal 322, and a resistor 704 between the terminal 712 and the output terminal 322. One end of a third Josephson junction device 715 is grounded, while the other end is connected to the output terminal 322. A third control line 713 coupled to input terminals 204 and 205 is arranged near the third Josephson junction device 715. The output of the internal cell as described with reference to FIG. 3 is connected to these input terminals. On the other hand, the output terminal 322 is connected to the output pad 206 of the LSI. The output cell thus constructed operates as stated below.

Since alternating current supplied from the A.C. source 710 crosses zero periodically, all the Josephson junction devices in FIG. 11 return to the superconducting states at that time. During the time interval during which current of or above a predetermined value flows from the A.C. source 710 toward 711, current flows through the first and second control lines 705 and 706 from the terminal 711 toward the terminal 712. This current flowing through the control lines is in the same direction as that of the bias current flowing through the first bias line 707 as to the first Josephson junction device 701, whereas it is in the opposite direction to that of the bias current flowing through the second bias line 707 as to the second Josephson junction device 702. Therefore, the magnetic flux which is generated by the bias current and the control current interlinks with the first Josephson junction device 701, whereas it does not interlink with the second Josephson junction device 702. In consequence, the first Josephson junction device 701 is in the non-superconducting state, and the second Josephson junction device 702 in the superconducting state. Accordingly, a positive pulse voltage clamped at a gap voltage $V_g$ appears at the terminal 711, and the terminal 712 is at the ground level. Accordingly, part of the current from the A.C. source 710 flows also into the Josephson junction device 715 through the resistor 703. Likewise, during the time interval during which current of or above a predetermined value flows from the A.C. source 710 toward the terminal 712, the voltage of the terminal 711 becomes the ground level, and that of the terminal 712 becomes the positive pulse voltage clamped at the gap voltage $V_g$. Accordingly, part of the current from the A.C. source 710 flows into the Josephson junction device 715 through the resistor 704. Whether the current supplied via the resistor 703 or the resistor 704 flows entirely through the third Josephson junction device 715 or shunts to a transmission line 207 through the output terminal 322, is controlled by the control current which flows through the third control line 713 via the terminals 204 and 205. As thus far described, the circuit shown in FIG. 11 is the so-called two-valued logic circuit wherein the current to flow through the load assumes two statuses; the status in which it is null, and the status in which it flows toward the ground. In addition, the circuit has the merit of an A.C.-driven circuit in having a large load driving capacity. Therefore, it is adapted to directly drive the internal cell of another LSI through the transmission line 207.

Figure 12:
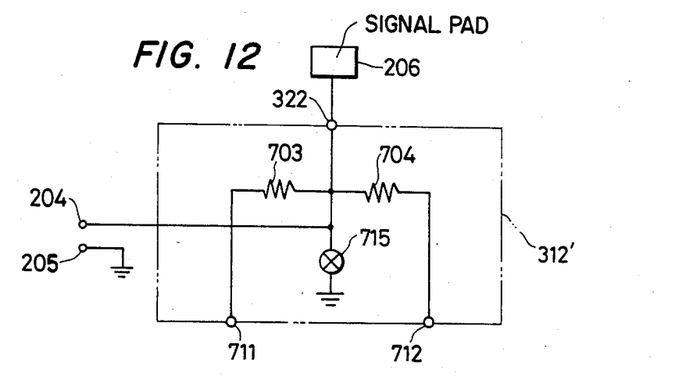

FIG. 12 shows a switching circuit 312' which can be used in place of the switching circuit 312 of the output cell in FIG. 11. It differs from the switching circuit 312 of FIG. 11 in that one end of the Josephson junction device 715 is connected directly to the input terminal 204. Such a circuit is generally known as a current injection logic circuit (CIL circuit), and it can provide an output signal similar to that of the circuit in FIG. 11.

Figure 13:
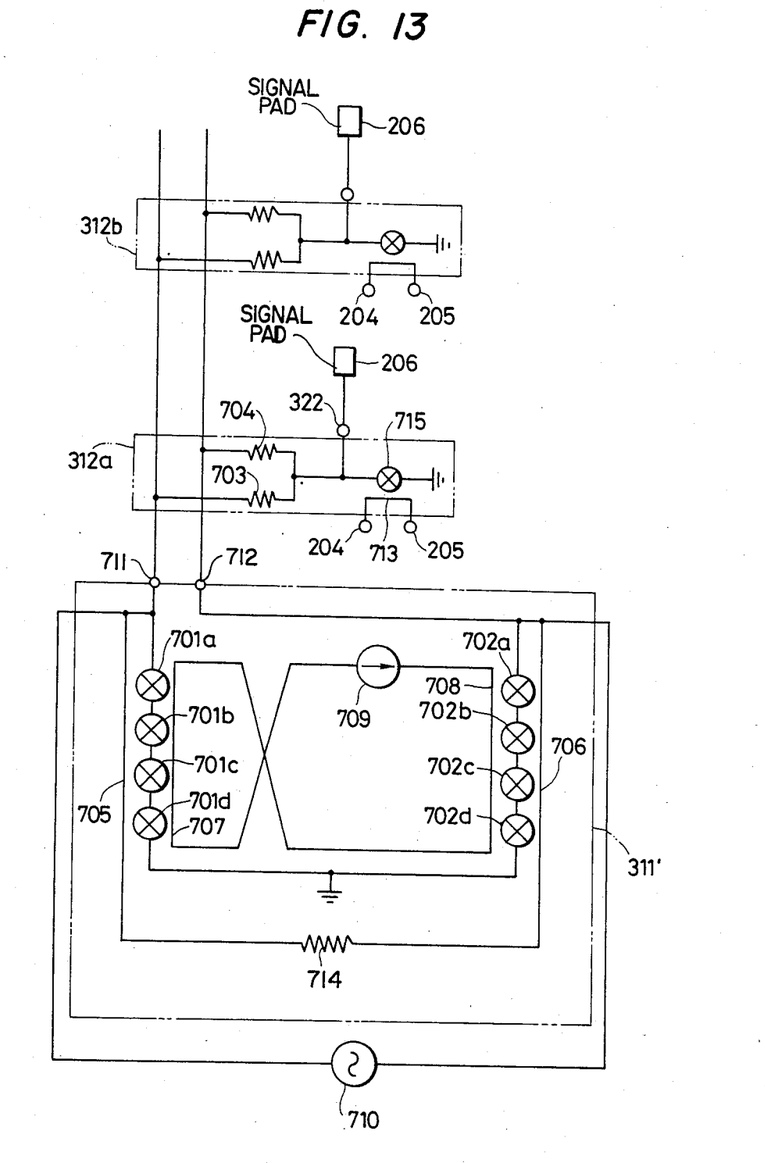

FIG. 13 shows an embodiment of the output cell wherein the circuit of FIG. 11 is put into a more practical circuit arrangement. In a rectifier circuit 311', there are used Josephson junction devices 701a, 701b, 701c and 701d connected in series and Josephson junction devices 702a, 702b, 702c and 702d connected in series. This point differs from the rectifier circuit 311 in FIG. 11. When the serially-connected Josephson junction devices are used in this manner, the voltages to be provided at the terminals 711 and 712 can be made great. A plurality of switching circuits 312a and 312b are connected to the terminals 711 and 712. Each of the switching circuits is the same as the switching circuit 312 shown in FIG. 11. It is supplied with current from the rectifier circuit 311', and delivers from the pad 206 a two-valued output signal which responds to the control current applied between the terminals 204 and 205.

Figure 14:
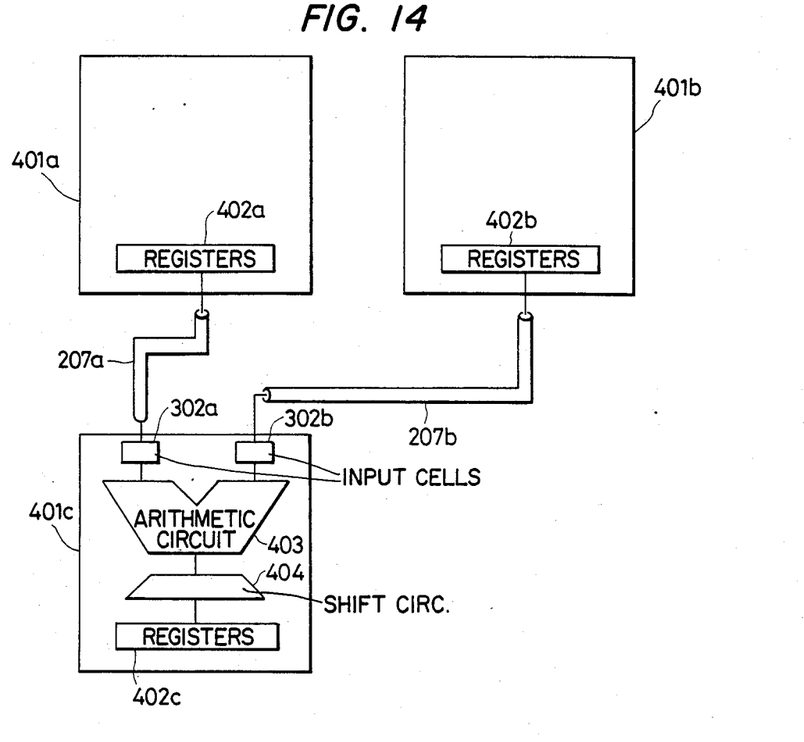
FIG. 14 shows a favorable example of logical construction which uses the LSIs of the present invention.
Figure 15:
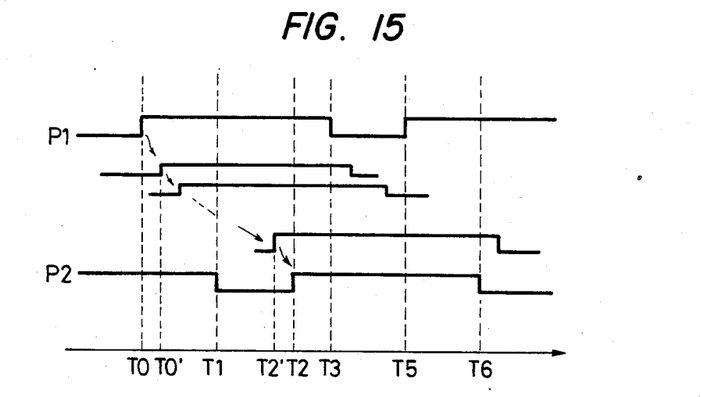
FIG. 15 is a time chart showing operations in FIG. 14.

FIG. 14 shows a preferred example of a logic constructing method which uses the LSIs according to the present invention. The basic logic construction of a digital system including a computer is to process the data of a first group of registers and then transmit them to a second group of registers. In the logic constructing method illustrated in FIG. 14, the first group of registers 402a and 402b are constructed of the output cells of LSIs 401a and 401b. As explained in the embodiments of FIGS. 3 and 4, all these output cells are constructed of the A.C.-driven circuits. Since the A.C.-driven circuit holds data unless the power source is turned "off", it is a circuit which is convenient for use as a register. The phase of the A.C. source to be applied to the A.C.-driven circuits is caused to correspond to the timing of the set or reset of the group of registers. Output signals from the first group of registers 402a and 402b are applied to an LSI 401c through respective transmission lines 207a and 207b. Within the LSI 401c, there are comprised, for exmple, an arithmetic ciruit 403, a shift circuit 404 and a second group of registers 402c. Among them, the arithmetic circuit 403 and the shift circuit 404 which drive the interior of the LSI are constructed of the D.C.-driven circuits being the internal cells. Accordingly, the external inputs are received through input cells 302a and 302b which convert the three-valued logic of the A.C.-driven circuits into the two-valued logic. The second group of registers 402c for driving the exterior of the LSI are constructed of the output cells, namely, the A.C.-driven circuits. FIG. 15 illustrates the timings of gate circuits and the register groups in the case of the logic construction shown in FIG. 14. The A.C. source is switched at the timing indicated by P1 in FIG. 15, for the first group of registers 402a and 402b, and at the timing indicated by P2 in FIG. 15, for the second group of registers 402c. The first group of registers 402a and 402b retain data signals for the period of time from a time $T_{10}$ to a time $T_3$, and are reset for the period of time from the time $T_3$ to a time $T_5$. The second group of registers 402c are reset for the period of time from a time $T_1$ to a time $T_2$, and retain data signals for the period of time from the time $T_2$ to a time $T_6$. After having passed through the transmission lines 207a and 207b, the data signals of the first group of registers 402a and 402b reach the LSI 401c at a time $T_o'$. Thereafter, the data signals are processed by the D.C.-driven circuits included in the internal cells of the LSI 402c, and they reach the second group of registers 402c at a time $T_2'$. The data signals having reached the group of registers 402c are set therein at the time $T_2$. Thereafter, the data signals of the first group of registers 402a and 402b are reset in the period of time between the time $T_3$ and the time $T_5$, and new data signals are set in the first group of registers at the time $T_5$. As thus far described, with the logic LSIs of the present invention, only the groups of registers corresponding to the output portions of the respective LSIs have the control timings adjusted by the phase of the A.C. source, while the internal portions of the respective logic LSIs are the D.C.-driven circuits and can therefore have the respective operating timings designed properly.

In the foregoing embodiments, it is to be understood that all the Josephson junction devices not especially specified may be either mere Josephson junctions or Josephson interferometers as disclosed in, e.g., U.S. Pat. No. 4,117,503.

While, in the above, the example of using the CS circuit as the D.C.-driven circuit has been mentioned, a different D.C.-driven circuit can also be used. By way of example, it is the so-called "Huffle" circuit described in 'IEEE TRANSACTIONS ON MAGNETICS', Vol. MAG-15, No. 1, January 1979, pp. 408-411, or the so-called complementary circuit disclosed in Japanese Laid-open Pat. No. 50-92670 (1975).

Similarly, as the A.C.-driven circuit, there can be used circuits other than the JTL circuit, for example, a CIL circuit disclosed in U.S. Pat. No. 4,117,354, a JAWS circuit disclosed in U.S. Pat. No. 4,051,393, and a DCL circuit disclosed in '1979 IDEM Technical Digest', pp. 482-484.

What is claimed is:

1. A Josephson logic integrated circuit formed on a single substrate comprising:
   an input Josephson circuit for converting an input three-valued current signal into a two-valued current signal;
   a Josephson logic circuit connected to said input Josephson circuit and a D.C. current source for performing a logical operation on the converted two-valued current signal supplied from said input Josephson circuit and for providing a two-valued current signal corresponding to the result of the logical operation, said two-valued current signal having two logic values "1" and "0"; and
   an output Josephson circuit connected to said Josephson logic circuit comprised of:
   a Josephson junction device with one end thereof being grounded and with the other end thereof being connected to an A.C. current source, and
   a control line arranged adjacent to said Josephson junction device and connected to receive the two-valued current signal from said Josephson logic circuit for controlling said Josephson junction device so that said output Josephson circuit provides a three-valued current signal based upon the received two-valued current signal from said Josephson logic circuit,
   said three-valued current signal having three logic values "+1", "0" and "-1".

2. A Josephson logic integrated circuit according to claim 1, wherein said Josephson logic circuit includes first and second Josephson junction devices and first and second inductors constituting a closed loop circuit, a middle point of which closed loop circuit is supplied with a gate current from a D.C. source, a control line being arranged adjacent to said first and second Josephson junction devices, and a bias line being arranged adjacent to one of said Josephson junction devices.

3. A Josephson logic integrated circuit according to claim 1, wherein said input Josephson circuit includes two Josephson interferometers to form one superconducting loop, a middle point of which loop is connected to a D.C. source through a resistor, a control line being arranged adjacent to said interferometers, and a bias line being arranged adjacent to one of said Josephson interferometers.

4. A Josephson logic integrated circuit according to claim 1, wherein said input Josephson circuit includes:
   a first Josephson interferometer having a first resistor connected in parallel therewith, and a second Josephson interferometer having a second resistor connected in parallel therewith, wherein said first and second interferometers are connected in series with one another, one end of said series connection being grounded, while the other end is connected to a D.C. source;
   a control line arranged adjacent to said interferometers; and
   a bias line being arranged adjacent to one of said Josephson interferometers.

5. A Josephson logic integrated circuit according to claim 1, wherein said input Josephson circuit includes:
   a first Josephson interferometer, one end of which is grounded, while the other end is connected to both a positive D.C. source through a first resistor and to an output terminal through a second resistor;
   a second Josephson interferometer, one end of which is grounded, while the other end is connected to both a negative D.C source through a third resistor and to said output terminal through a fourth resistor;
   a control line arranged adjacent to said interferometers; and
   a bias line arranged adjacent to one of said Josephson interferometers.

6. A Josephson logic integrated cricuit according to claim 1, wherein said input Josephson circuit includes:
   a Josephson junction device, one end of which is grounded, while the other end is connected to a D.C. source through a first resistor and is grounded through second resistor; and
   a control line arranged adjacent to said Josephson junction device.

7. A Josephson logic integrated circuit formed on a single substrate comprising:
   a Josephson logic circuit connected to a D.C. current source for performing a logical operation on an input two-valued current signal and for providing a two-valued current signal corresponding to the result of the logical operation, said two-valued current signal having two logic values "1" and "0";
   an output Josephson circuit connected to said Josephson logic circuit for providing a two-valued current signal based upon the received two-valued current signal from said Josephson logic circuit, said output Josephson circuit being comprised of a rectifier circuit and a switching circuit,
   said rectifier circuit including a first Josephson junction device, one end of which is grounded, while the other end is connected to a first terminal, a second Josephson junction device, one end of which is grounded, while the other end is connected to a second terminal, first and second control lines arranged adjacent to said first and second Josephson junction devices, respectively, and first and second bias lines arranged adjacent to said first and second Josephson junction devices, respectively,
   said switching circuit including a third Josephson junction device, one end of which is grounded, while the other end is connected to a transmission line located outside of said integrated circuit and is further connected to said first terminal through a first resistor and to said second terminal through a second resistor, and control means for supplying an input two-valued current signal applied from said Josephson logic circuit to said third Josephson junction device, and
   an A.C. source connected between said first and second terminals.

8. A Josephson logic integrated circuit according to claim 7, wherein said control means includes an input terminal connected directly to the other end of said third Josephson junction device.

9. A Josephson logic integrated circuit according to claim 7, wherein said control means comprises a third control line arrangement adjacent to said third Josephson junction device to couple said input signals to said third Josephson junction device.

10. A Josephson logic integrated circuit according to claim 7, wherein said rectifier circuit further includes one or more Josephson junction devices inserted in series with said first and second Josephson junction devices, respectively.

* * * * *